United States Patent
Mochizuki et al.

(10) Patent No.: US 7,629,564 B2
(45) Date of Patent: Dec. 8, 2009

(54) CONVERSION APPARATUS, RADIATION DETECTING APPARATUS, AND RADIATION DETECTING SYSTEM

(75) Inventors: Chiori Mochizuki, Sagamihara (JP); Keiichi Nomura, Honjo (JP); Minoru Watanabe, Honjo (JP); Takamasa Ishii, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 191 days.

(21) Appl. No.: 11/912,373

(22) PCT Filed: Jul. 10, 2006

(86) PCT No.: PCT/JP2006/314112

§ 371 (c)(1),
(2), (4) Date: Oct. 23, 2007

(87) PCT Pub. No.: WO2007/007881

PCT Pub. Date: Jan. 18, 2007

(65) Prior Publication Data

US 2009/0127435 A1     May 21, 2009

(30) Foreign Application Priority Data

Jul. 11, 2005  (JP)  ............................ 2005-201604
Jun. 30, 2006  (JP)  ............................ 2006-181891

(51) Int. Cl.
  *H01L 27/00* (2006.01)
(52) U.S. Cl. ............ 250/208.1; 250/214.1; 250/370.09; 250/370.14; 257/292
(58) Field of Classification Search .............. 250/208.1, 250/214.1, 370.09, 370.11, 370.14; 257/59, 257/72, 291, 292, 44; 348/302, 308
See application file for complete search history.

(56) References Cited

U.S. PATENT DOCUMENTS

| | | |
|---|---|---|
| 2002/0005520 A1 | 1/2002 | Mochizuki et al. |
| 2004/0223587 A1 | 11/2004 | Tsujii |
| 2009/0075405 A1 * | 3/2009 | Watanabe et al. ............. 438/15 |

FOREIGN PATENT DOCUMENTS

| | | |
|---|---|---|
| JP | 2000-114531 A1 | 4/2000 |
| JP | 2002-50754 A1 | 2/2002 |
| JP | 2004-325261 A1 | 11/2004 |
| JP | 2005-136254 A1 | 5/2005 |

OTHER PUBLICATIONS

PCT International Search Report mailed Mar. 10, 2006, for International Application No. PCT/JP2006/314112.

\* cited by examiner

*Primary Examiner*—Kevin Pyo
(74) *Attorney, Agent, or Firm*—Fitzpatrick, Cella, Harper & Scinto

(57) ABSTRACT

A conversion apparatus of the present invention includes a plurality of pixels including switching elements and conversion elements. The pixels are arranged in a pixel region including a switching element region in which switching elements are arranged in row and column directions and a conversion element region in which conversion elements are arranged in row and column directions. A plurality of wirings are including a second metal layer are connected to the plurality of switching elements of the column direction. Plural bias wirings of a fourth metal layer are connected to plural conversion elements. An external signal wiring of the fourth metal layer outside the pixel region is connected to the signal wirings. An external bias wiring of a first metal layer outside the pixel region is connected to the plurality of bias wirings. The external signal wiring and the external bias wiring intersect each other.

15 Claims, 12 Drawing Sheets

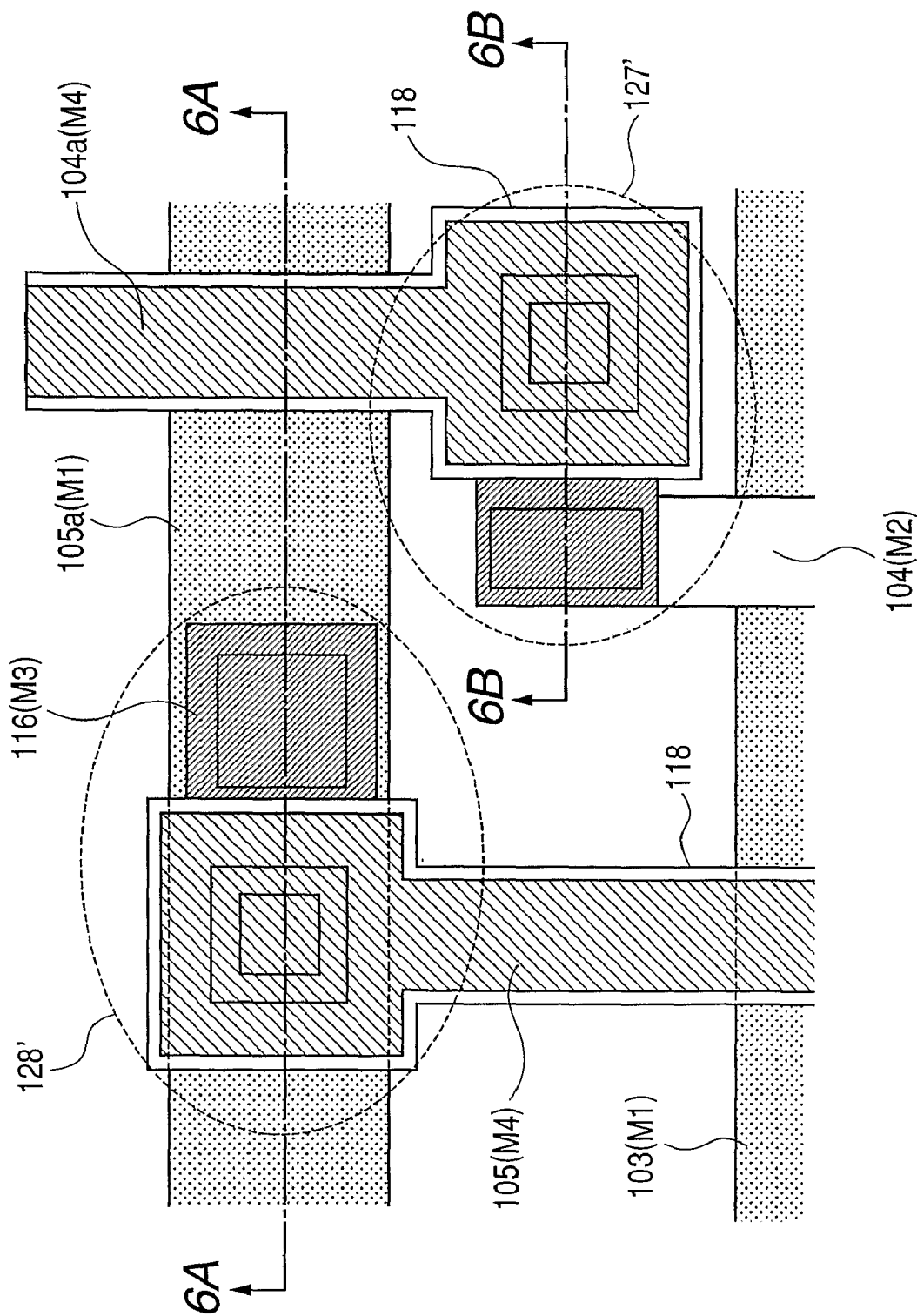

Prior Art

CONVERSION APPARATUS, RADIATION DETECTING APPARATUS, AND RADIATION DETECTING SYSTEM

TECHNICAL FIELD

The present invention relates to a conversion apparatus applied to a medical image diagnosis apparatus, a non-destructive inspection apparatus, an analyzer using radioactive rays, or the like, a radiation detecting apparatus using the conversion apparatus, and a radiation detecting system. In the description, electromagnetic waves of visible light or the like, X-rays, α-rays, β-rays, γ-rays, and the like are included in the radioactive rays.

BACKGROUND ART

Conventionally, radiography used for medical image diagnosis has been classified into general radiography such as X-ray radiography for obtaining a static image, and fluoroscopic radiography for obtaining a moving image. Each radiography including a imaging apparatus and an image pickup apparatus are selected as occasion demands.

In the conventional general radiography, two systems described below have mainly been implemented. One is a screen film imaging (abbreviated as SF imaging hereinafter) system which executes imaging through film exposure, developing, and fixing by using a screen film prepared by combining a fluorescent screen and a film. The other is a computed radiography imaging (abbreviated as CR imaging hereinafter) system which records a radioactive ray image as a latent image in an photostimulable phosphor, scans the photostimulable phosphor with a laser to output optical information according to the latent image, and reads the output optical information by a sensor. However, in the conventional general radiography, there has been a problem in that a process of obtaining the radioactive ray image is complex. The obtained radioactive ray image can be converted into digital data, but it is indirectly digitized. Thus, there arises a problem in that it takes much time to obtain digitized radioactive ray image data.

Next, in the conventional fluoroscopic radiography, an image intensifier radiography (abbreviated as I. I. radiography hereinafter) system that uses a fluorescent material and an electron tube has mainly been employed. However, in the conventional fluoroscopic radiography, there has been a problem in that an apparatus is large-scaled because of use of the electron tube. The use of the electron tube has created difficulty in obtaining an image having a large area because of a small field of view (detection area). Furthermore, there has been a problem in that a resolution of an obtained image is low because of the use of the electron tube.

Thus, in recent years, attention has been focused on a sensor panel configured by arranging, in a 2-dimensional matrix, a plurality of pixels having conversion elements and switch elements for converting radioactive rays or light from fluorescent materials into charges. In particular, attention has been focused on a flat panel detector (abbreviated as FPD hereinafter) in which a plurality of pixels having conversion elements prepared by, on an insulating substrate, non-single crystal semiconductors such as amorphous silicon (abbreviated as a-Si hereinafter) or the like, and thin-film transistors are arranged (abbreviated as TFT hereinafter) prepared by non-single crystal semiconductors in a 2-dimensional matrix.

This FPD can obtain an electric signal based on the image information by converting, by the conversion element, radioactive rays having image information into charges, and reading the charges by the switch element. Accordingly, the image information can be directly taken out as digital signal information from the FPD, so handling of image data such as storage, processing, and transfer is facilitated to enable further use of the radioactive ray image information. Characteristics such as sensitivities of the FPD depend on radiography conditions. As compared with the conventional SF or CR imaging system, however, equal or better characteristics have been verified. Additionally, as the electric signal having the image information can be directly obtained from the FPD, as compared with the conventional SF or CR imaging system, there is an advantage that time necessary for obtaining an image is shortened.

As the FPD, as described in International Application Publication No. WO 93/14418, a PIN type FPD has been known which uses a sensor panel configured by arranging, in a 2-dimensional matrix, a plurality of pixels formed of PIN type photodiodes made of a-Si and TFTs. Such the PIN type FPD has a laminated structure in which a layer constituting a PIN type photodiode is disposed on a layer constituting the TFT on a substrate. As described in U.S. Pat. No. 6,075,256, an MIS type FPD has been known which uses a sensor panel configured by arranging, in a 2-dimensional matrix, a plurality of pixels formed of MIS type photosensors made of a-Si and TFTs. Such the MIS type FPD has a plane structure in which the MIS type photosensor is disposed by the same layer configuration as that constituting the TFT on the substrate. Furthermore, as described in U.S. Application Publication No. 2003-0226974, an MIS type FPD of a laminated structure has been known in which a layer constituting the MIS type photosensor is disposed on the layer constituting the TFT on the substrate.

The above-mentioned FPD will be described below by taking the example of U.S. Application Publication No. 2003-0226974 with reference to the drawings. For simpler explanation, an example of an FPD arranged at a 3×3 2-dimensional matrix will be taken.

FIG. 10 is a schematic equivalent circuit diagram showing an equivalent circuit of a conventional FPD described in US 2003/0226974. FIG. 11 is a schematic plan diagram of one pixel of the conventional FPD described in U.S. Application Publication No. 2003-0226974. FIG. 12 is a schematic sectional diagram cut on the line 12-12 of FIG. 11.

In the intersection portions of the FPD having the above laminated structure, the wirings are insulated from each other via the insulating layers. However, as reliabilities at the intersection portions are greatly affected by manufacturing yield or image quality, insulating property is highly required among the wirings. In particular, signal charges generated by the photoelectric conversion element and transferred by the switching element flow to the signal wiring. Thus, the influence of parasitic capacitance or wiring resistance of the signal wiring causes noise of an image signal to be output, creating a possibility of adversely affecting the image signal. In particular, the radiation detecting apparatus which outputs signal charges by a small exposure radiation dosage and must have a high sensitivity, as a noise influence is large because of small signal charges generated by the photoelectric conversion element. It is necessary to reduce the influence of parasitic capacitance or wiring resistance of the signal wiring. Consequently, it is necessary to secure insulation at the intersection portion of the signal wiring and the drive wiring, and insulation at the intersection portion of the signal wiring and the bias wiring, which cause parasitic capacitance in the signal wiring. It is particularly necessary to secure insulation between the signal wiring and the bias wiring. Reasons for this will be described below.

As described above, the first insulating layer, the first semiconductor layer, and the first impurity semiconductor layer similar to those used for the switching element are present between the wirings at the intersection portion of the signal wiring and the drive wiring. As these layers are formed in the process of forming the switching element, layer quality is high, and the first insulating layer exhibits very high insulating property because it is used for the gate insulating film of the switching element. Thus, as the insulating property is high between the signal wiring and the drive wiring at the intersection portion, the drive wiring is formed thick and the wiring width is narrowed so as to reduce the influence of parasitic capacitance, whereby the influence of noise can also be reduced. On the other hand, the interlayer insulating layer, the second insulating layer, the second semiconductor layer, and the second impurity semiconductor layer are present between the signal wiring and the bias wiring at the intersection portion. As these layers are formed after the switching element is formed, a forming temperature thereof must be lower than an endurance temperature of the switching element. Generally, since the endurance temperature of the switching element is lower than the forming temperature, the interlayer insulating layer formed in an upper layer thereof is formed at a temperature lower than that of the first insulating layer. Even when an inorganic material similar to that of the first insulating layer is used for the interlayer insulating layer, its insulation is low due to the low forming temperature. Even when an organic material also serving as a planarized film is used, although different from the case of the first insulating layer, to form the interlayer insulating film its insulating property is lowered as the organic material has lower insulating property compared to that of the inorganic material in most cases. When the MIS type photosensor is used, the second insulating layer that can be made of the same material as that of the first insulating layer is disposed, however, the second insulating layer is formed at a temperature lower than that of the first insulating layer as in the case of the interlayer insulating layer. Accordingly, the second insulating layer has lower insulating property than the first insulating layer. As described above, the insulating property at the intersection portion between the signal wiring and the bias wiring is lower than that at the intersection portion between the signal wiring and the drive wiring.

Furthermore, a reduction in wiring resistance which causes noise in the signal wiring is required. When such a reduction of the wiring resistance is achieved by its shape, generally, the wiring is formed thick or large in width. However, in the FPD configured by arranging the wirings in the matrix, when the wiring is formed large in width, an area at the intersection portion between the wirings becomes large which causes an increase in parasitic capacitance. Thus, the wiring is not formed so large in width. Hence, the wiring resistance is reduced mainly by forming the wiring thick.

However, when the signal wiring is formed thick, it is accompanied by an enlargement of a step. When the step is enlarged by the signal wiring, it is difficult to uniformly form the interlayer insulating film disposed by covering the signal wiring. When an inorganic material is used for the interlayer insulating film, it is difficult to form the interlayer insulating film to be thick. Thus, it is difficult to form the interlayer insulating film which covers a side surface of the signal wiring to be in similar thickness to that of the surface. Accordingly, at the intersection portion between the signal wiring and the bias wiring, insulating property is reduced between the side surface of the signal wiring and the bias wiring, thus increasing possibilities of leakage and of generation of uneven line images. In other words, when each wiring is formed thick for the purpose of reducing noise, leakage occurs between the wirings. Moreover, prevention of leakage leads to insufficient improvement in terms of noise.

DISCLOSURE OF THE INVENTION

The present invention has been made to solve the foregoing problems, and has an object to provide a photoelectric conversion apparatus configured by stacking photoelectric conversion element layers including a photoelectric conversion element over a switching element layer including a switching element, and a radiation detecting apparatus, for preventing leakage caused by an intersection portion between wirings and suppressing noise. Thereby a high S/N ratio can be obtained. Accordingly, image information of high image quality can be obtained.

A conversion apparatus and a radiation detecting apparatus according to the present invention includes: an insulating substrate; a pixel region including a switching element region in which a plurality of switching elements each including a first metal layer disposed over the insulating substrate, an insulating layer disposed over the metal layer, a first semiconductor layer, and a second metal layer are arranged in row and column directions, a conversion element region in which a plurality of conversion elements each including a lower electrode made of a third metal layer disposed over the switching element region, a second semiconductor layer disposed over the lower electrode, and an upper electrode made of a fourth metal layer disposed over the second semiconductor layer are arranged in row and column directions, and each pixels including the switching elements and the conversion elements; a plurality of signal wirings including the second metal layer, signal wirings being connected to the plurality of switching elements of the column direction; a plurality of bias wirings including the fourth metal layer, bias wirings being connected to the plurality of conversion elements; an external signal wiring portion including the fourth metal layer outside the pixel region, the external signal wiring portion being connected to the signal wirings; and a external bias wiring portion including the first metal layer outside the pixel region, the external bias wiring portion being connected to the plurality of bias wirings, in which the external signal wiring and the external bias wiring intersect each other.

The conversion apparatus and the radiation detecting apparatus of the present invention includes a pixel region including a switching element formed of a first metal layer disposed over an insulating substrate, an insulating layer disposed over the first metal layer, a first semiconductor layer, and a second metal layer, a conversion element including a lower electrode made of a third metal layer formed on the switching element, a second semiconductor layer disposed over the lower electrode, and an upper electrode made of a fourth metal layer disposed over the second semiconductor layer, and a plurality of pixels including the switching elements and the conversion elements in row and column directions, signal wirings connected to the plurality of switching elements of the column direction, and bias wirings connected to the plurality of conversion elements. At intersection portions between the signal wirings and the bias wirings, each signal wiring is including the fourth metal layer, and each bias wiring is including the first metal layer.

According to the present invention, high insulating property is secured at the intersection portion between the signal wiring and the bias wiring outside the pixel region. And thus capacitance between the signal wiring and the bias wiring which becomes parasitic capacitance of the signal wiring is reduced. Whereby noises added to signal charges can be suppressed and an image signal of a high S/N ratio can be obtained. Thus, it is possible to obtain image information of high image quality. Moreover, thick signal wirings can be disposed and wiring resistance of the signal wirings is reduced, whereby it is possible to improve sensitivities of the photoelectric conversion apparatus and the radiation detecting apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 5 is a conceptual plan diagram in which an area A of a photoelectric conversion apparatus and a radiation detecting apparatus is enlarged according to a second embodiment;

BEST MODE FOR CARRYING OUT THE INVENTION

The best modes for carrying out the present invention will be described below in detail with reference to the drawings.

First Embodiment

Figure 1:
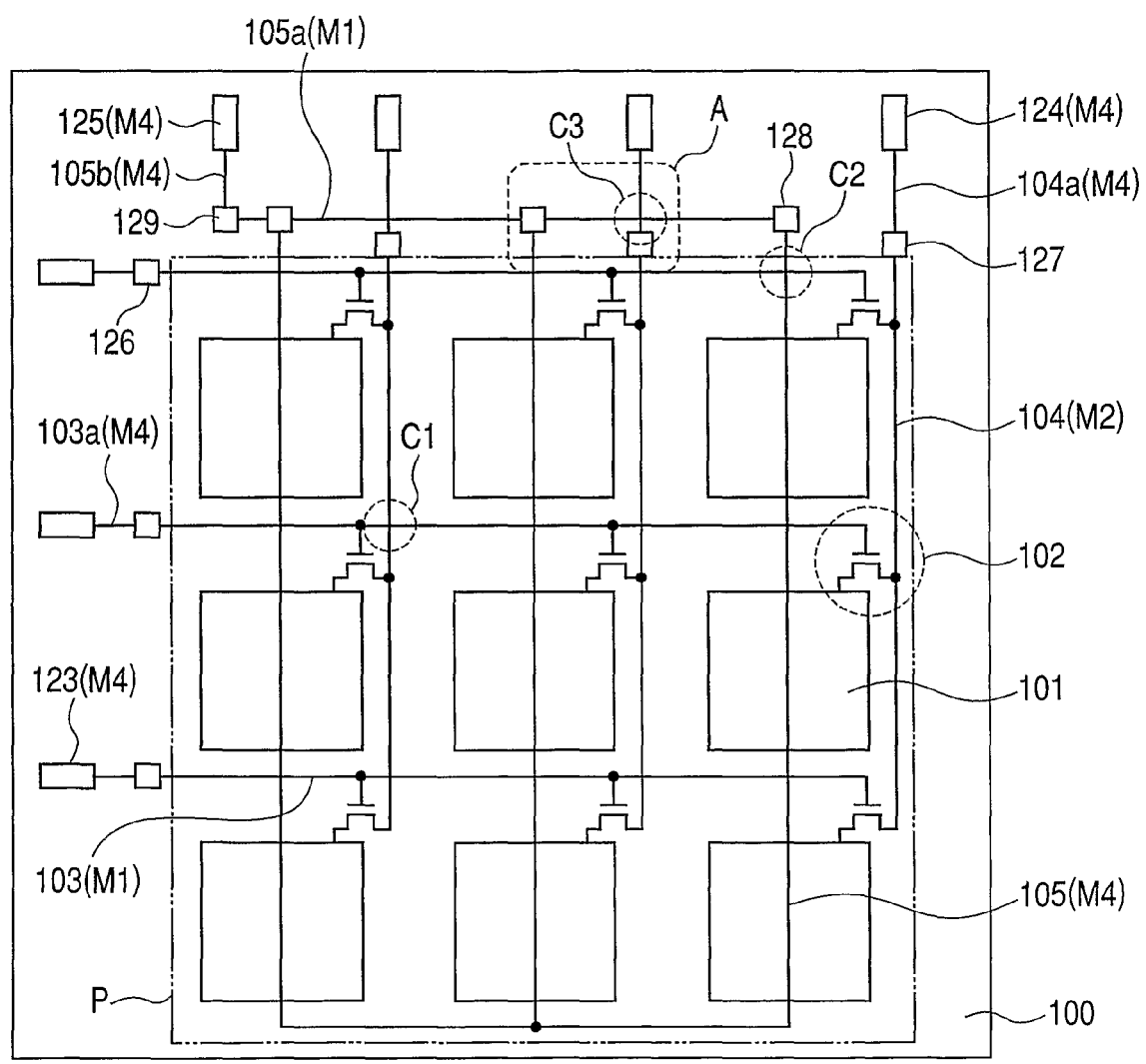
FIG. 1 is a conceptual plan diagram of a photoelectric conversion apparatus and a radiation detecting apparatus according to the present invention.
Figure 2:
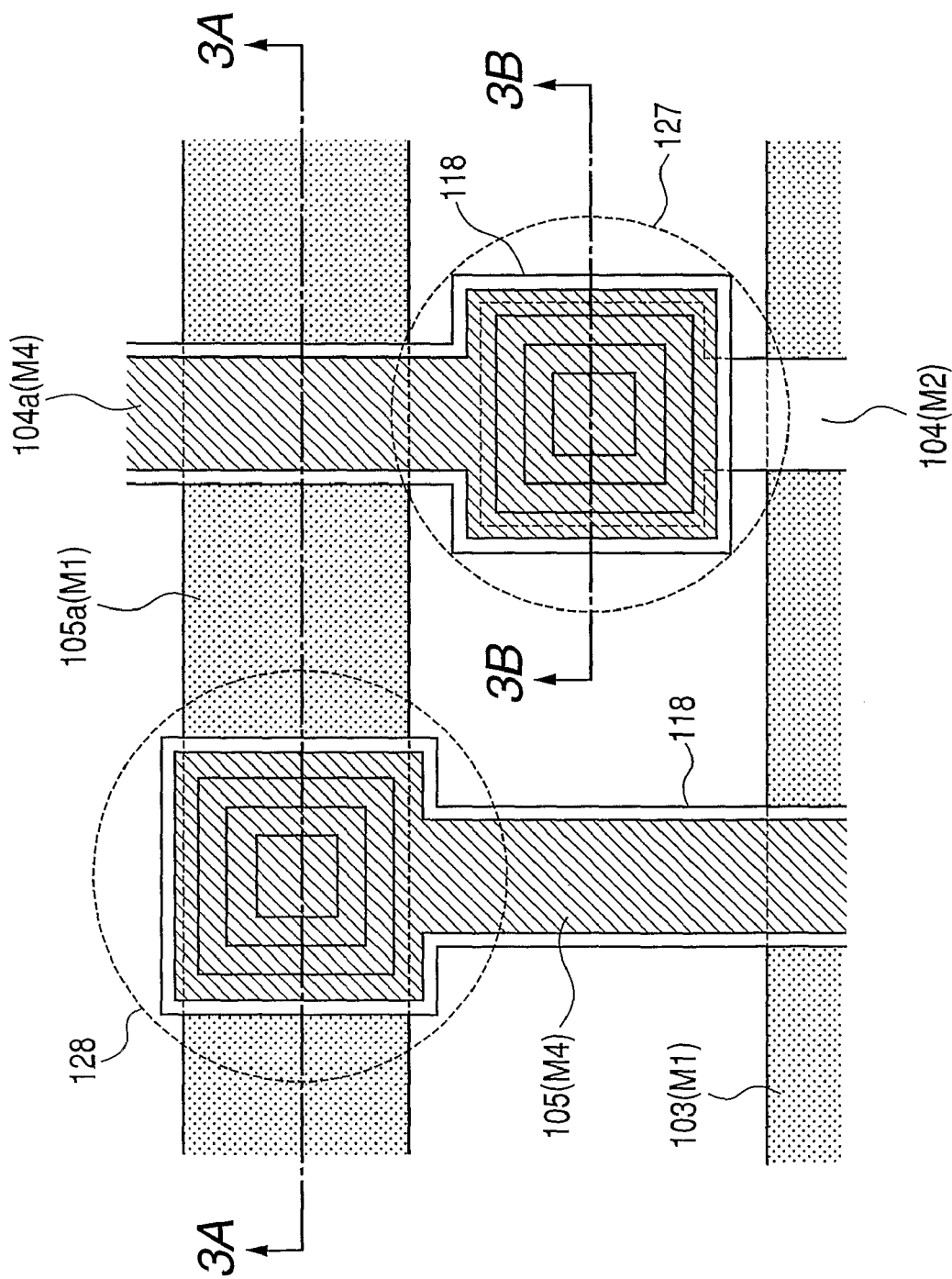
FIG. 2 is a conceptual plan diagram in which an area A of a photoelectric conversion apparatus and a radiation detecting apparatus is enlarged according to a first embodiment.
Figure 3A:
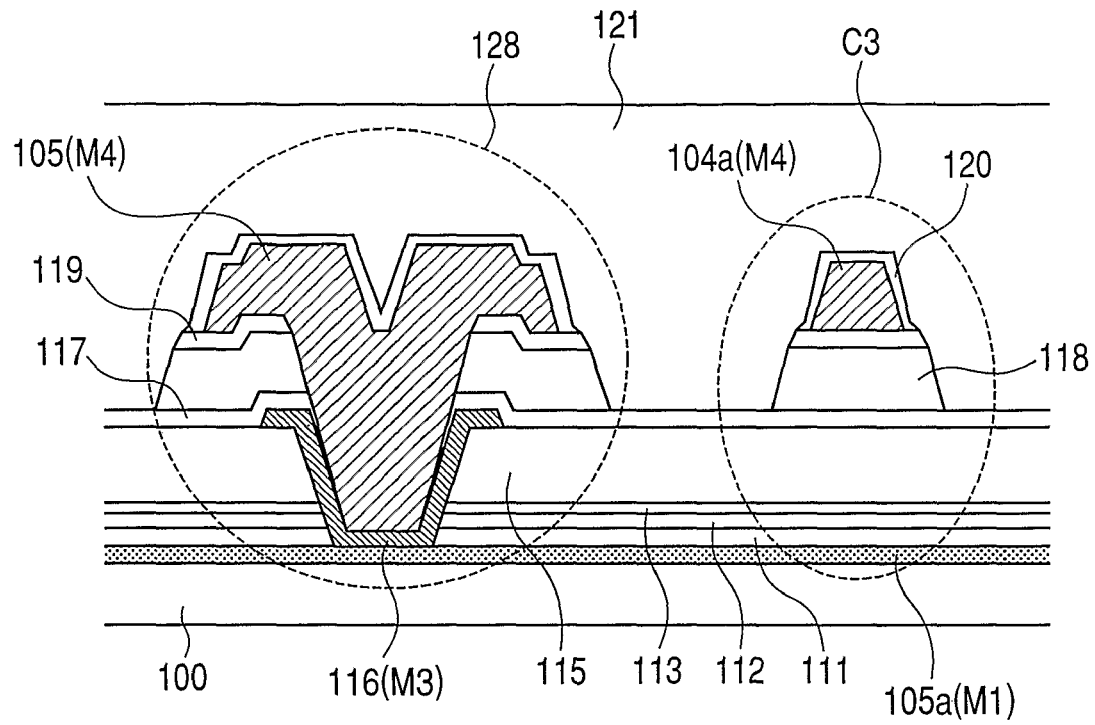
FIGS. 3A and 3B are schematic sectional diagrams of the photoelectric conversion apparatus and the radiation detecting apparatus according to the first embodiment.
Figure 3B:
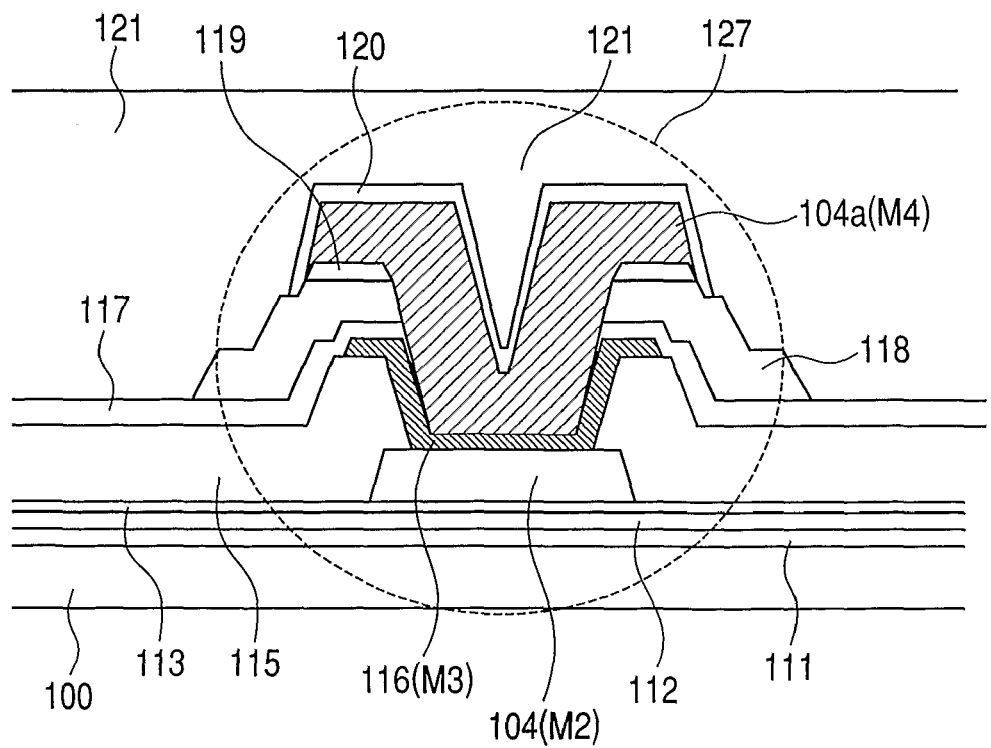
Figure 10:
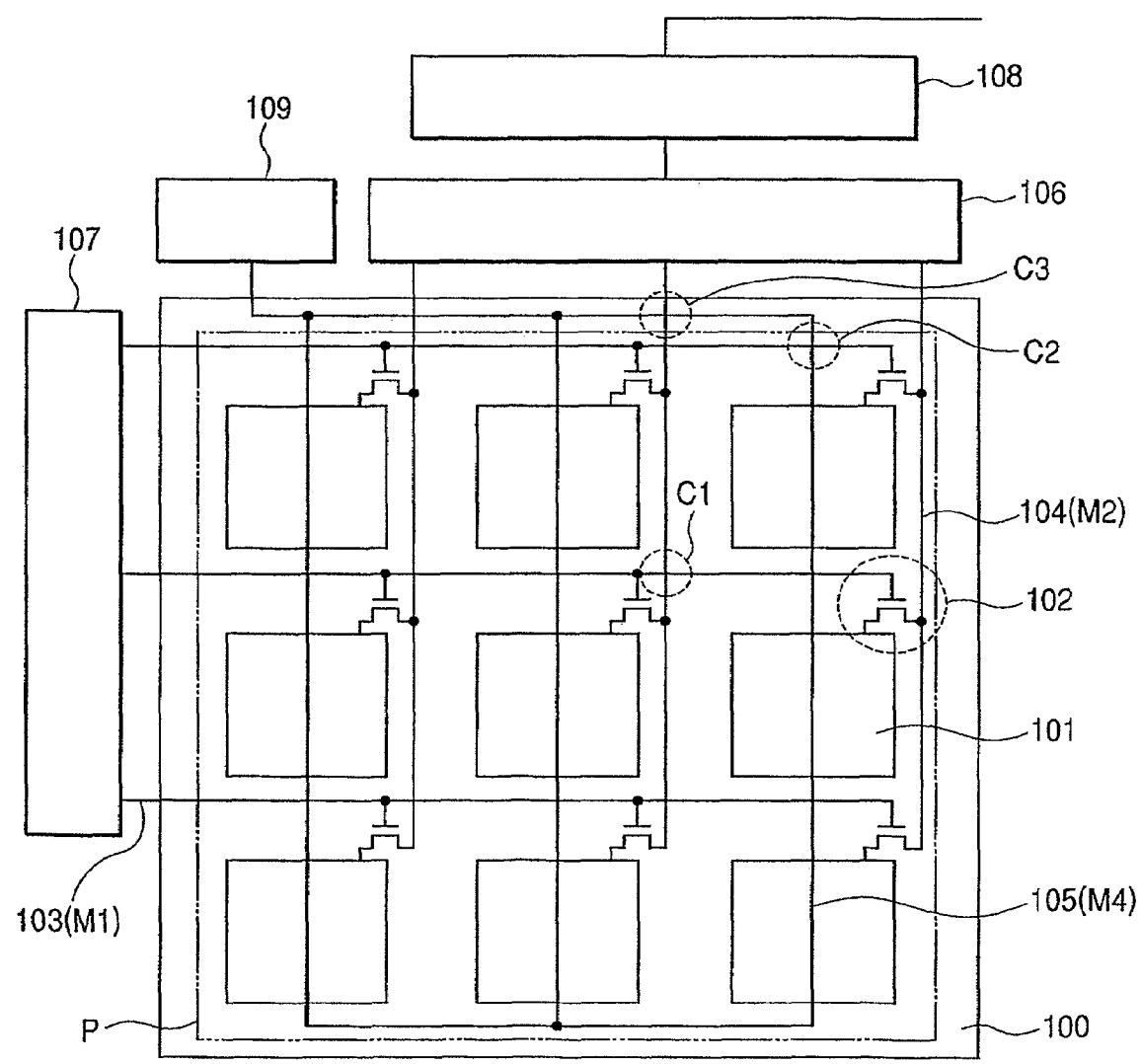
FIG. 10 is a conceptual plan diagram showing a conventional photoelectric conversion apparatus and a conventional radiation detecting apparatus.
Figure 11:
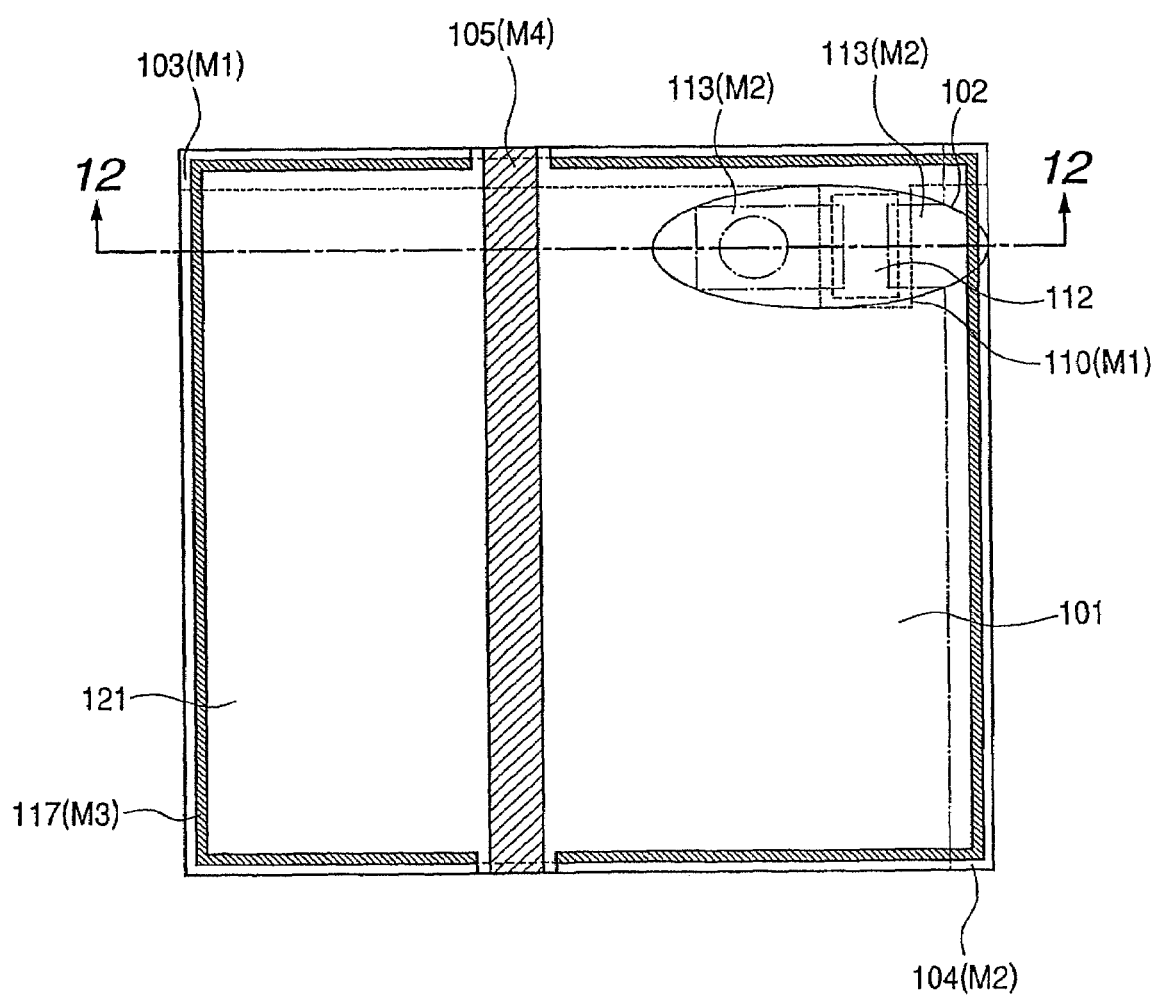
FIG. 11 is a conceptual plan diagram showing one pixel of the conventional photoelectric conversion apparatus and the conventional radiation detecting apparatus.
Figure 12:
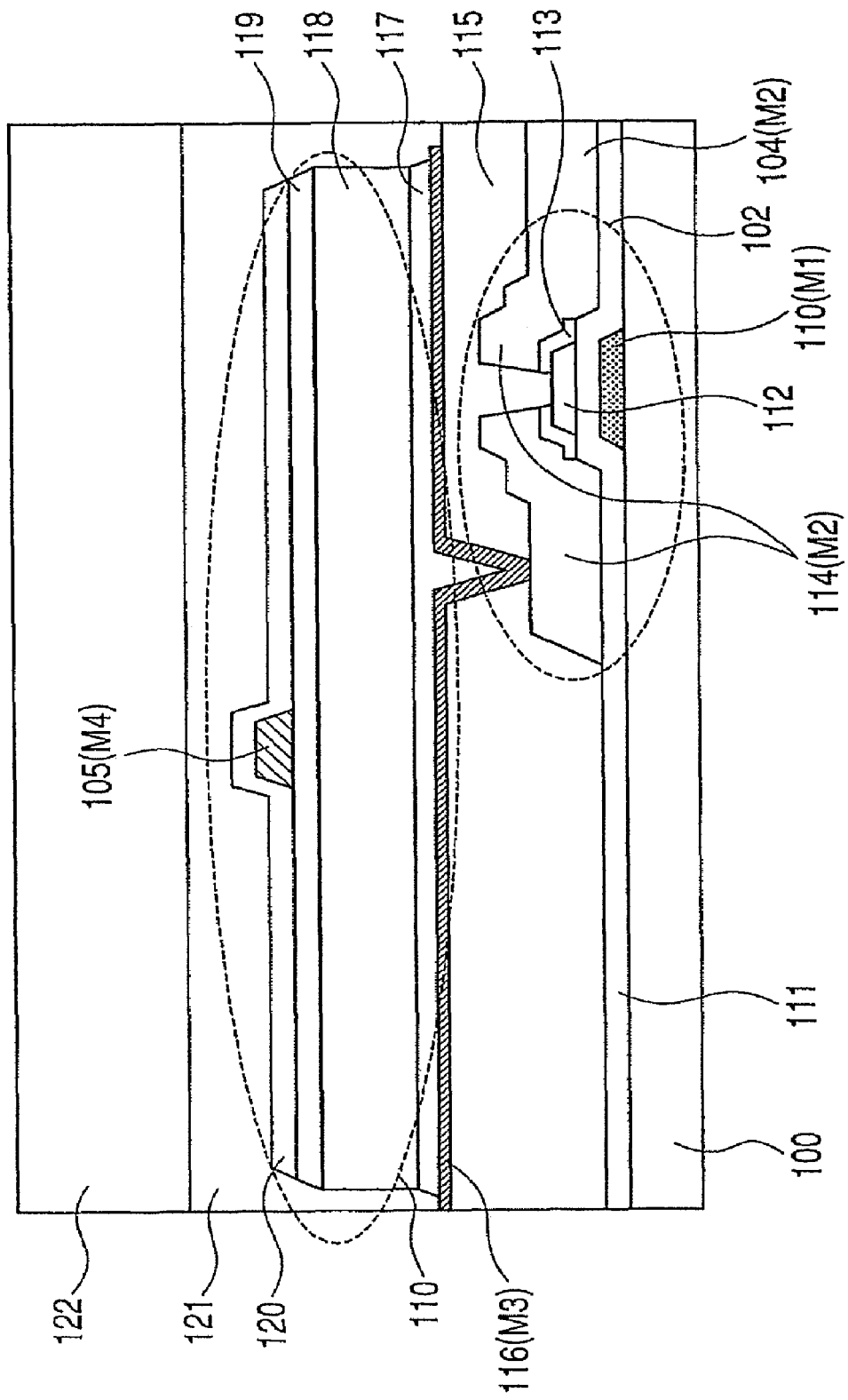
FIG. 12 is a conceptual sectional diagram showing the conventional photoelectric conversion apparatus and the conventional radiation detecting apparatus.

Referring to FIGS. 1 to 3B, a first embodiment of the present invention will be described in detail. FIG. 1 is a conceptual plan diagram showing a photoelectric conversion apparatus and a radiation detecting apparatus according to the first embodiment of the present invention. FIG. 2 is a conceptual plan diagram of the enlarged area A of FIG. 1. FIG. 3A is a schematic sectional diagram taken on the line 3A-3A of FIG. 2. FIG. 3B is a schematic sectional diagram taken on the line 3B-3B of FIG. 2. In FIGS. 1 to 3B, the same components as those of the conventional FPD shown in FIGS. 10 to 12 will be denoted by the same reference numerals, and detailed description thereof will be omitted.

In FIGS. 1 to 3B, reference numeral 100 denotes an insulating substrate, 101 a photoelectric conversion element which is a conversion element, 102 a switching element, 103 a drive wiring, 104 a signal wiring, and 105 a bias wiring. For the insulating substrate 100, a glass substrate, a quartz substrate, a plastic substrate or the like is suitably used. The photoelectric conversion element 101 is an MIS type photosensor made of a-Si, the switching element is a TFT made of a-Si, and the photoelectric conversion element 101 and the switching element 102 constitute one pixel. Such pixels are arranged in a 2-dimensional matrix to constitute a pixel region P. The drive wiring 103 is a wiring connected to gate electrodes 110 of a plurality of switching elements 102 arrayed in a row direction, and formed of a first metal layer M1 which is the same layer as that of the gate electrodes 110 of the switching elements 102. The signal wiring 104 is a wiring connected to source or drain electrodes 114 of a plurality of switching elements 102 arrayed in a column direction, and formed of a second metal layer M2 which is the same layer as that of the source or drain electrodes 114 of the switching elements. The bias wiring 105 is a wiring connected to an upper electrode layer 120 to apply a bias to the photoelectric conversion element 101, thereby constituting a sensor upper electrode, and formed of a fourth metal layer M4 made of a metallic material such as Al. In FIG. 2, to simplify the drawing, first to second insulating layers 111 to 117 are omitted.

According to the first embodiment of the present invention, reference symbol 103a denotes a drive wiring drawing portion connected to each drive wiring 103 via a contact hole 126 outside the pixel region P. The drive wiring drawing portion 103a includes a drive wiring terminal 123 disposed to electrically connect with a drive circuit 107. The drive wiring drawing portion 103a and the drive wiring terminal 123 are formed of a fourth metal layer M4 which is the same layer as that of the bias wiring 105 as an uppermost metal layer in an FPD of a laminated structure. Accordingly, because of a structure in which there is only a protective layer 121 on a drive wiring terminal 123, an opening for electrical connection with the drive circuit 107 is easily formed. Because the drive wiring drawing portion 103a and the drive wiring terminal 123 are formed of the same fourth metal layer M4 as that of the bias wiring 105, as in the case of the bias wiring 105, the surface thereof is covered with an upper electrode layer 120. Thus, it is possible to prevent corrosion of the fourth metal layer M4 in the drive wiring terminal 123.

Reference symbol 104a denotes a signal wiring drawing portion connected to each signal wiring 104 via a contact hole 127 outside the pixel region P. The signal wiring drawing portion 104a includes a signal wiring terminal 124 disposed to electrically connect with a signal processing circuit 106. The signal wiring drawing portion 104a and the signal wiring terminal 124 are formed of the fourth metal layer M4 which is the same layer as that of the bias wiring 105 as an uppermost metal layer in the FPD of the laminated structure. Accordingly, because of a structure in which there is only a protective layer 121 on the signal wiring terminal 124, an opening for electrical connection with the signal processing circuit 106 is easily formed. Because the signal wiring drawing portion 104a and the signal wiring terminal 124 are formed of the same fourth metal layer M4 as that of the bias wiring 105, as in the case of the bias wiring 105, the surface thereof is covered with the upper electrode layer 120. Thus, it is possible to prevent corrosion of the fourth metal layer M4 in the signal wiring terminal 124.

Next, reference symbol 105a denotes a first bias wiring drawing portion connected to each bias wiring 105 via a contact hole 128 outside the pixel region P. The first bias wiring drawing portion 105a is formed of a first metal layer M1 which is the same layer as that of the drive wiring 103 as a lowermost metal layer in the FPD of the laminated structure. The first bias wiring drawing portion 105a is connected to a second bias wiring drawing portion 105b via a contact hole 129. The second bias wiring drawing portion 105b includes a bias wiring terminal 125 to electrically connect with a bias power source part 109. In this case, the bias wiring drawing portion 105b and the bias wiring terminal 125 are formed of the fourth metal layer M4 which is the same layer as that of the bias wiring 105 as an uppermost metal layer in the FPD of the laminated structure. Accordingly, because of a structure in which there is only a protective layer 121 on the bias wiring terminal 125, an opening for electrical connection with the bias power source part 109 is easily formed. Because the bias wiring drawing portion 105b and the bias wiring terminal 125 are formed of the same fourth metal layer M4 as that of the bias wiring 105, as in the case of the bias wiring 105, the surface thereof is covered with the upper electrode layer 120. Thus, it is possible to prevent corrosion of the fourth metal layer M4 in the bias wiring terminal 125.

Next, referring to FIG. 3A, a sectional structure of the bias wiring 105 and the first bias wiring drawing portion 105a at a contact 128 and a sectional structure of the first bias drawing wiring 105a and the signal wiring drawing portion 104a at an intersection portion C3 will be described in detail. Referring to FIG. 3B, a sectional structure of the signal wiring 104 and the signal wiring drawing portion 104a at a contact 127 will be described in detail.

In FIGS. 3A and 3B, reference numeral 111 denotes a first insulating layer, 112 a first semiconductor layer which is a layer identical to an active layer of the switching element 102, 113 a first impurity semiconductor layer which is a layer identical to an ohmic contact layer of the switching element 102, and 115 an interlayer insulating layer. Reference numeral 116 denotes a third metal layer M3 which is the same layer as a sensor lower electrode, 117 a second insulating layer which is a layer identical to an insulating layer of an MIS type photosensor, 118 a second semiconductor layer which is a layer identical to a photoelectric conversion layer of the MIS type photosensor, 119 a second impurity semiconductor layer which is a layer identical to an ohmic contact layer of the MIS type photosensor, 120 a transparent electrode layer which is a layer identical to the upper electrode layer of the MIS type photosensor, and 121a protective layer. Here, a wavelength converter 122 is omitted.

In FIG. 3A, the contact 128 is provided via the third metal layer 116 by boring an opening in the first insulating layer 111, the first semiconductor layer 112, the first impurity semiconductor layer 113, the interlayer insulating layer 115, the second insulating layer 117, the second semiconductor layer 118, and the second impurity semiconductor layer 119. Accordingly, the first bias wiring drawing portion 105a formed of the first metal layer M1 and the bias wiring 105 formed of the fourth metal layer M4 are electrically connected to each other. The intersection portion C3 is insulated between the first bias wiring drawing portion 105a formed of the first metal layer M1 and the signal wiring drawing portion 104a formed of the fourth metal layer M4 via the first insulating layer 111, the first semiconductor layer 112, the first impurity semiconductor layer 113, the interlayer insulating layer 115, the second insulating layer 117, the second semiconductor layer 118, and the second impurity semiconductor layer 119. In this case, as in the case of the other intersection portions C1 and C2, the intersection portion C3 of the first embodiment of the present invention is insulated via the first insulating layer 111 which composes a gate insulating film of the switching element 102. Because this first insulating layer 111 is used as the gate insulating film of the switching element 102, a dielectric constant is extremely low, and one with large resistance and high insulating property is used. Thus, by interposing the first insulating layer 111 having a low dielectric constant and high insulating property at the intersection portion C3, it is possible to reduce parasitic capacitance and to prevent leakage between the wirings. As compared with the conventional intersection portion C3, there are many interpolated layer structures, and accordingly a distance can be increased between the first bias wiring drawing portion 105a and the signal wiring drawing portion 104a. Hence, the parasitic capacitance can be further reduced.

Next, in FIG. 3B, the contact 127 is provided via the third metal layer 116 by boring an opening in the interlayer insulating layer 115, the second insulating layer 117, the second semiconductor layer 118, and the second impurity semiconductor layer 119. Accordingly, the signal wiring drawing portion 104a formed of the fourth metal layer M4 and the signal wiring 104 formed of the second metal layer M2 are electrically connected to each other.

As in the case of the contact 128, the contact 129 is provided via the third metal layer 116 by boring an opening in the first insulating layer 111, the first semiconductor layer 112, the first impurity semiconductor layer 113, the interlayer insulating layer 115, the second insulating layer 117, the second semiconductor layer 118, and the second impurity semiconductor layer 119. Accordingly, the first bias wiring drawing portion 105a formed of the first metal layer M1, the second bias wiring drawing portion 105b formed of the fourth metal layer M4, and the bias wiring terminal 125 are electrically connected to one another.

Figure 4:
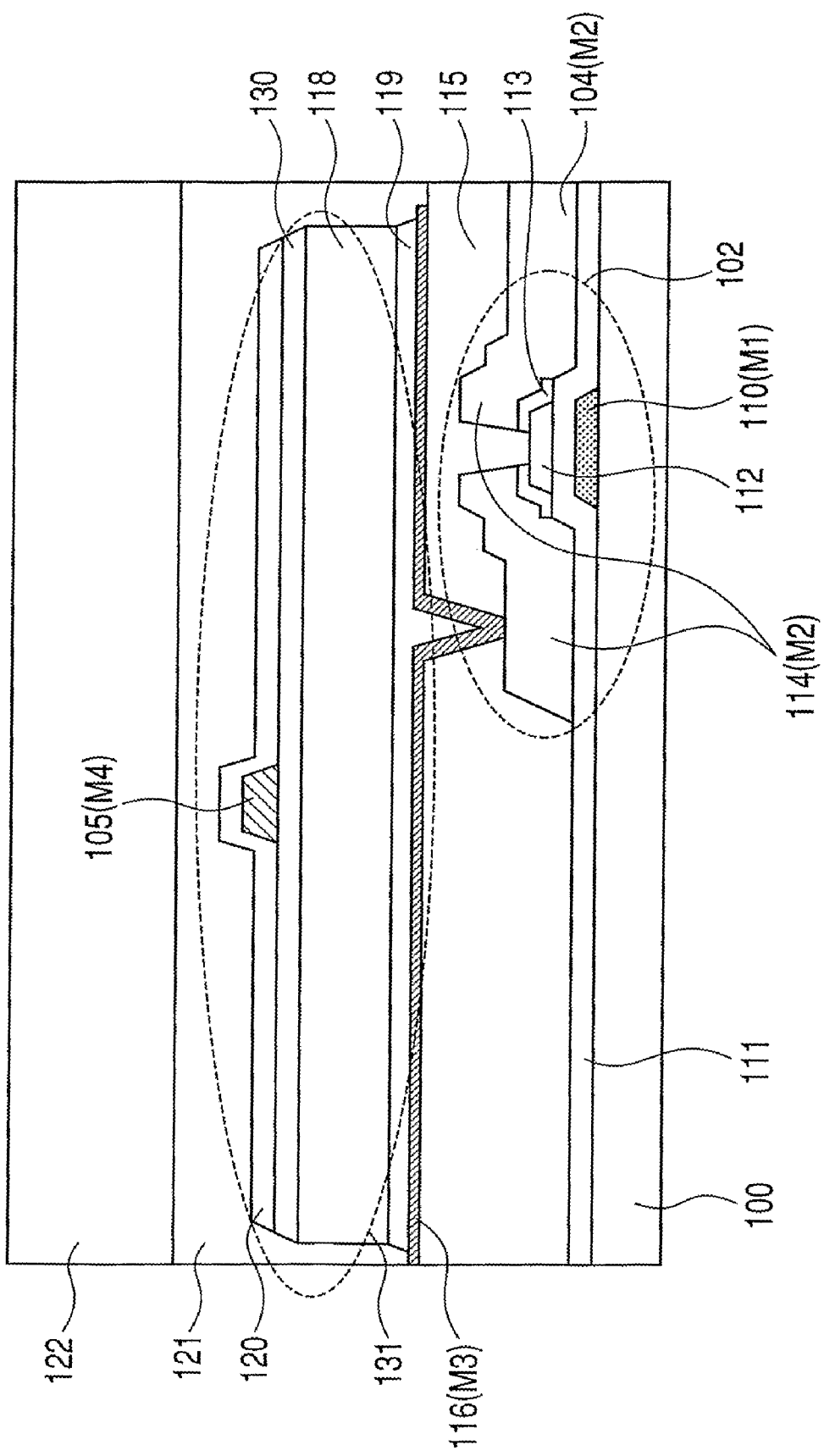
FIG. 4 is a conceptual sectional diagram showing another example of a photoelectric conversion apparatus and a radiation detecting apparatus of the present invention.

This embodiment has described the case of the MIS type FPD of the laminated structure which uses the MIS type photosensor as the photoelectric conversion element 101. However, for a photoelectric conversion element similar to that shown in FIG. 4, a PIN type FPD that uses a PIN type photodiode 131 may be used. 130 is a third impurity semiconductor layer into which conductive impurities different from those of the second impurity semiconductor layer 119 have been introduced. In the PIN type photodiode, an n-type a-Si layer and a p-type a-Si layer are suitably used respectively for the second impurity semiconductor layer 119 and the third impurity semiconductor layer 130. This embodiment has described the case where the gap etching type TFT is used as the TFT which is the switching element 102. However, the present invention is not limited thereto. For example, a gap stopper type TFT or a planar type TFT employed by a poly-Si TFT may be used. In other words, when metal layers including three or more layers of at least the drive wiring 103, the signal wiring 104 and the bias wiring 105 are used in the combination of the switching element 102 and the photoelectric conversion element 101, improvements can be made according to the present invention. According to the embodiment, the signal wiring 104 and the source or drain electrode 114, and the sensor lower electrode are formed by using different metal layers, i.e., the signal wiring 104 and the source or drain electrode 114 by the second metal layer M2 and the sensor lower electrode by the third metal layer M3, respectively. However, the present invention is not limited thereto. The signal wiring 104, the source or drain electrode 114, and the sensor lower electrode (third metal layer) 116 may be formed by using identical metal layers. In this case, however, the signal wiring 104 and the sensor lower electrode cannot be stacked on each other, and the photoelectric conversion element cannot be completely stacked on the switching element. Thus, a numerical aperture of the FPD is lower as compared with that of the FPD formed by using different metal layers. This embodiment has described the case of the FPD which uses the MIS type photosensor 101 using the second semiconductor layer 118 made of a-Si or the PIN type photodiode as the conversion element. However, the present invention is not limited thereto. An FPD that uses a-Se or CdTe for the second semiconductor layer as a conversion element, and a conversion element for directly converting radioactive rays into charges may be used.

Second Embodiment

Figure 6A:
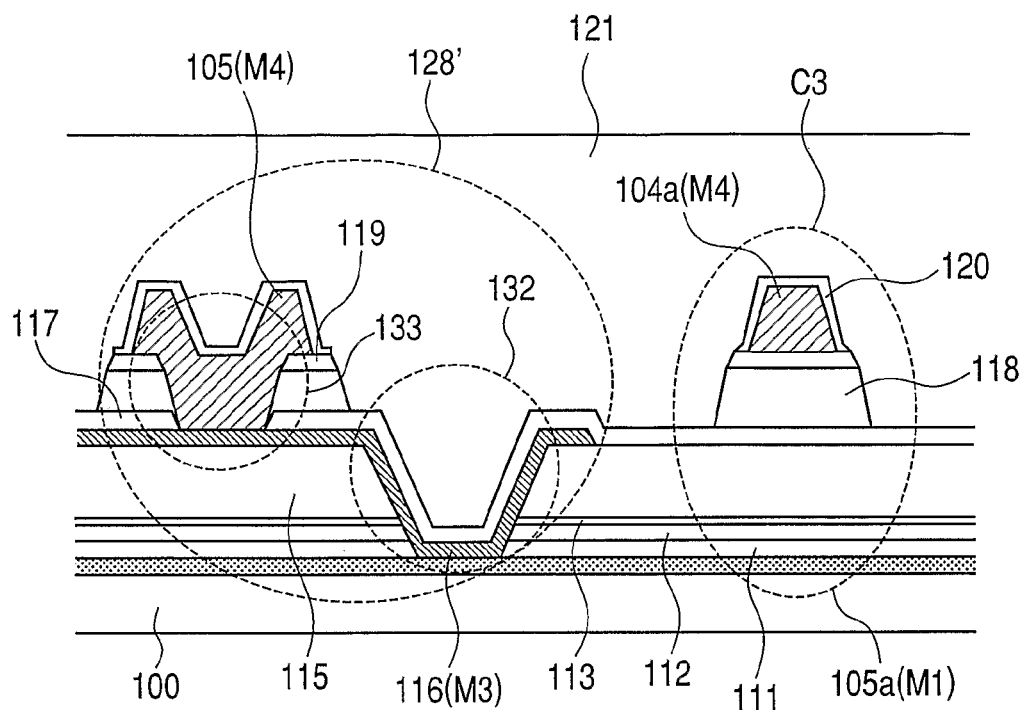
FIGS. 6A and 6B are schematic sectional diagrams of the photoelectric conversion apparatus and the radiation detecting apparatus according to the second embodiment.
Figure 6B:
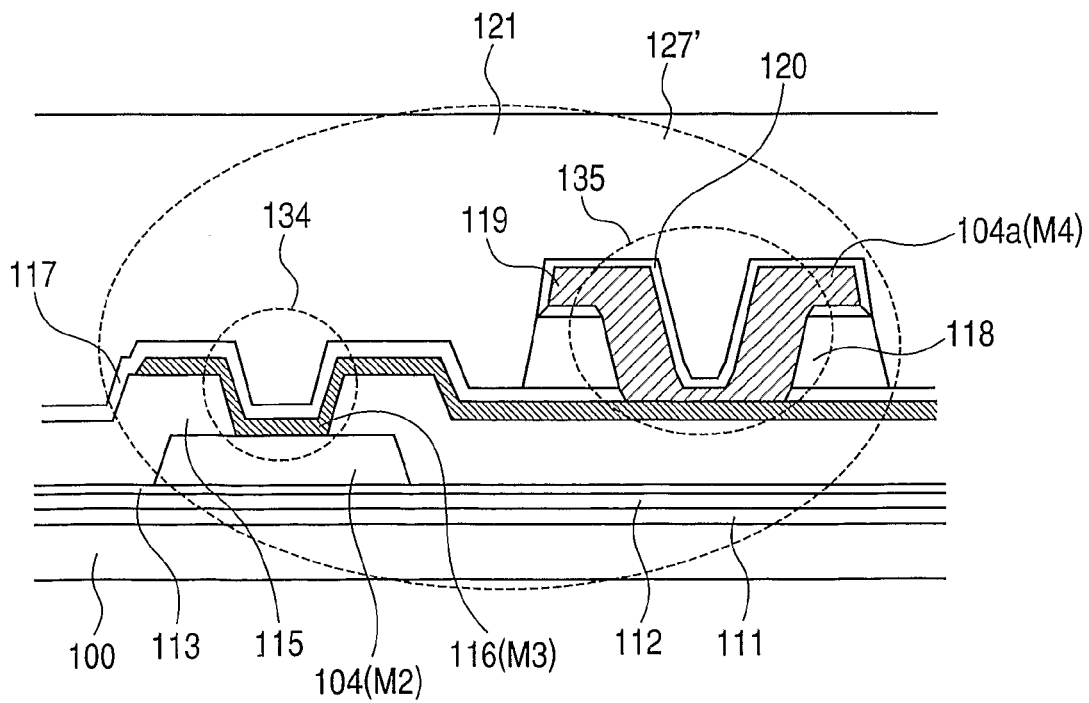

Referring to FIGS. 5 to 6B, a second embodiment of the present invention will be described in detail. FIG. 5 is a conceptual plan diagram in which the area A of FIG. 1 is enlarged. FIG. 6A is a schematic sectional diagram cut on the line 6A-6A of FIG. 5, and FIG. 6B is a schematic sectional diagram cut on the line 6B-6B of FIG. 5. In FIGS. 5 to 6B, components the same as those of the conventional FPD shown in FIGS. 10 to 12, and those of the first embodiment shown in FIGS. 1 to 3B will be denoted by the same reference numerals, and detailed description thereof will be omitted.

The contact 128 according to the first embodiment is formed via the third metal layer 116 disposed in the one opening on the first bias wiring drawing portion 105a. While the contact 128' according to the second embodiment is formed via the third metal layer 116 disposed in the two openings on the first bias wiring drawing portion 105a. That is a difference between the first and second embodiments. Also, according to the first embodiment, the contact 127 is formed via the third metal layer 116 at the opening on the signal wiring 104. According to the second embodiment, the contact layer 127' via the third metal layer 116 at the opening on the signal wiring 104 and at the opening not on the signal wiring 104. In that respect, the second embodiment is different form the first embodiment.

According to the present embodiment, as shown in FIG. 6A, the first opening 132 is formed in the first insulating layer 111, the first semiconductor layer 112, the first impurity semiconductor layer 113 and the interlayer insulating layer 115 on the first bias wiring drawing portion 105a. At the first opening 132, the first bias wiring drawing portion 105a is electrically connected to the third metal layer 116. A second opening 133 is disposed in a second insulating layer 117, a second semiconductor layer 118, and a second impurity semiconductor layer 119 on the third metal layer 116, and the third metal layer 116 and a bias wiring 105 are electrically connected to each other through the second opening 133. Accordingly, a contact 128' of the first bias wiring drawing portion 105a and the bias wiring 105 is formed.

As in the case of the first embodiment, an intersection portion C3 of the embodiment is insulated between the first bias wiring drawing portion 105a formed of a first metal layer M1 and a signal wiring drawing portion 104a formed of a fourth metal layer M4 via the first insulating layer 111, the first semiconductor layer 112, the first impurity semiconductor layer 113, the interlayer insulating layer 115, the second insulating layer 117, the second semiconductor layer 118, and the second impurity semiconductor layer 119. Thus, as in the case of the first embodiment, it is possible to reduce parasitic capacitance and to prevent leakage between the wirings.

Next, as shown in FIG. 6B, a third opening 134 is disposed in the interlayer insulating layer 115 on the signal wiring 104, and the signal wiring 104 and the third metal layer 116 are electrically connected to each other through the third opening 134. A fourth opening 135 is disposed in the second insulating layer 117, the second semiconductor layer 118, and the second impurity semiconductor layer 119 on the third metal layer 116, and the third metal layer 116 and the signal wiring drawing portion 104a are electrically connected to each other through the fourth opening 135. Accordingly, a contact 127' of the signal wiring 104 and the signal wiring drawing portion 104a is formed.

The first embodiment is advantageous in particular in case that a step between the opening and the contact is made larger. That case is, for example, that an organic insulating material is used as the interlayer insulating layer 115, therefore a thickness of the interlayer insulating layer would be made larger. And, also that is a case that, in order to improve a photoelectric conversion efficiency, the thickness of the second semiconductor layer 118 is to be made greater. When the step in the opening or the contact becomes large, an area of the opening or the contact is accordingly increased. Thus, according to the embodiment, by separately configuring the openings and the contacts, steps of the openings and the contacts are reduced one by one, whereby it is possible to limit forming areas of the openings and the contacts.

Third Embodiment

Figure 7:
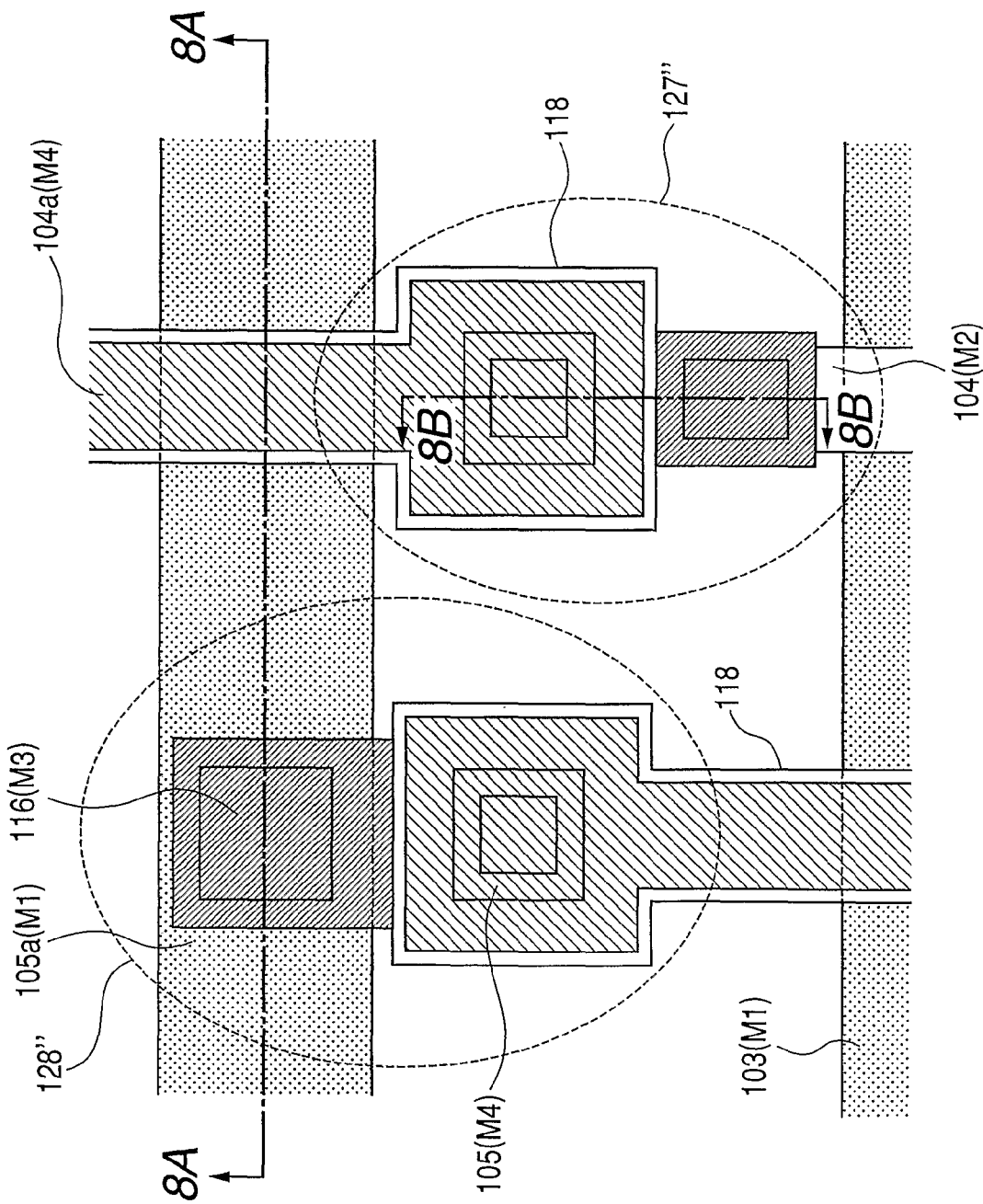
FIG. 7 is a conceptual plan diagram in which an area A of a photoelectric conversion apparatus and a radiation detecting apparatus is enlarged according to a third embodiment.
Figure 8A:
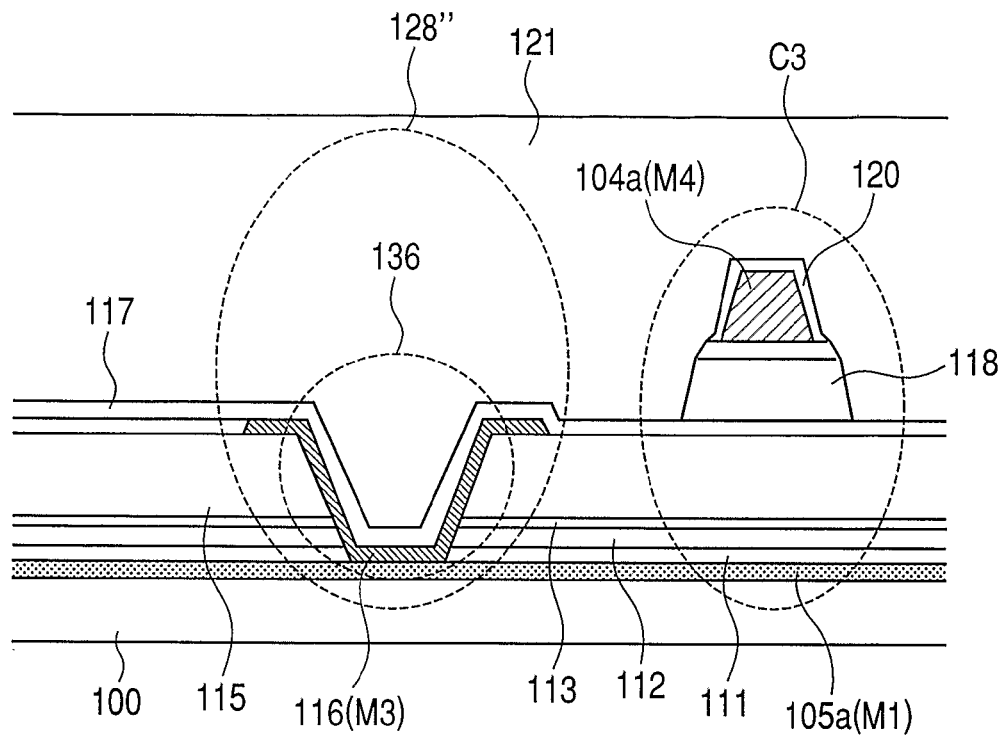
FIGS. 8A and 8B are schematic sectional diagrams of the photoelectric conversion apparatus and the radiation detecting apparatus according to the third embodiment.
Figure 8B:
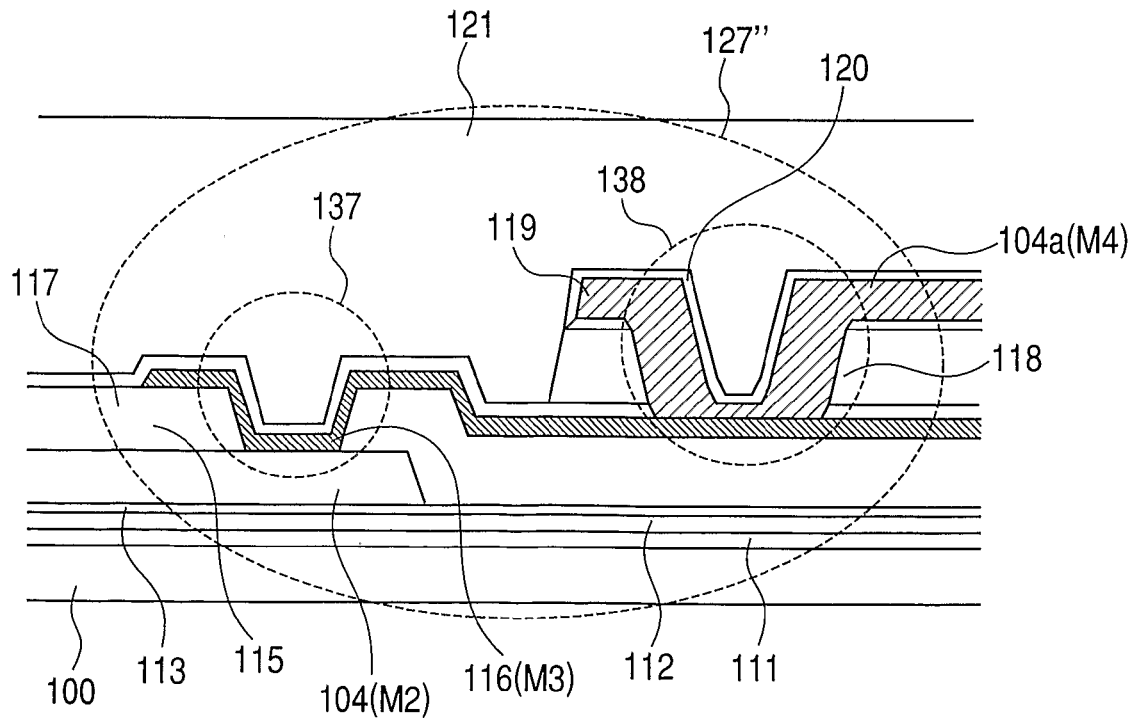

Referring to FIGS. 7 to 8B, a third embodiment of the present invention will be described in detail. FIG. 7 is a conceptual plan diagram in which the area A of FIG. 1 is enlarged. FIG. 8A is a schematic sectional diagram cut on the line 8A-8A of FIG. 7, and FIG. 8B is a schematic sectional diagram cut on the line 8B-8B of FIG. 7. In FIGS. 7 to 8B, components the same as those of the conventional FPD shown in FIGS. 10 to 12, those of the first embodiment shown in FIGS. 1 to 3B, and those of the second embodiment shown in FIGS. 5 to 6B will be denoted by the same reference numerals, and detailed description thereof will be omitted.

According to the second embodiment, the contact 128' formed via the third metal layer 116 at the two openings on the first bias wiring drawing portion 105a. According to the third embodiment, the contact 128" is formed via the third metal layer 116 at the opening on the first bias wiring drawing portion 105a and at the opening not on the first bias wiring drawing portion 105a. The contact 127' of the second embodiment is constituted via a third metal layer 116 in an opening disposed in a signal wiring 104 and an opening disposed in a position not on the signal wiring 104. In this regard, it is similar to the second embodiment, but the layout thereof is different.

According to the embodiment, as shown in FIG. 8A, a fifth opening 136 is disposed in a first insulating layer 111, a first semiconductor layer 112, a first impurity semiconductor layer 113, and an interlayer insulating layer 115 on a first bias wiring drawing portion 105a. And the first bias wiring drawing portion 105a and the third metal layer 116 are electrically connected to each other through the fifth opening 136. A sixth opening (not shown) is disposed in a second insulating layer 117, a second semiconductor layer 118, and a second impurity semiconductor layer 119 on the third metal layer 116, and the third metal layer 116 and a bias wiring 105 are electrically connected to each other through this sixth opening. Accordingly, a contact 128" of the first bias wiring drawing portion 105a and the bias wiring 105 is formed.

As in the case of the first and second embodiments, an intersection portion C3 of the embodiment is insulated between the first bias wiring drawing portion 105a formed of a first metal layer M1 and a signal wiring drawing portion 104a formed of a fourth metal layer M4 via the first insulating layer 111, the first semiconductor layer 112, the first impurity semiconductor layer 113, the interlayer insulating layer 115, the second insulating layer 117, the second semiconductor layer 118, and the second impurity semiconductor layer 119. Thus, as in the case of the first and second embodiments, it is possible to reduce parasitic capacitance and to prevent leakage between the wirings.

Next, as shown in FIG. 8B, a seventh opening 137 is disposed in the interlayer insulating layer 115 on the signal wiring 104, and the signal wiring 104 and the third metal layer 116 are electrically connected to each other through the seventh opening 137. An eighth opening 138 is disposed in the second insulating layer 117, the second semiconductor layer 118, and the second impurity semiconductor layer 119 on the third metal layer 116, and the third metal layer 116 and the signal wiring drawing portion 104a are electrically connected to each other through this eighth opening 138. Accordingly, a contact 127" of the signal wiring 104 and the signal wiring drawing portion 104a is formed.

According to the embodiment, as in the case of the second embodiment, by separately configuring the openings and the contacts, steps of the openings and the contacts are reduced one by one, whereby it is possible to limit forming areas of the openings and the contacts.

Fourth Embodiment

Application Example

Figure 9:
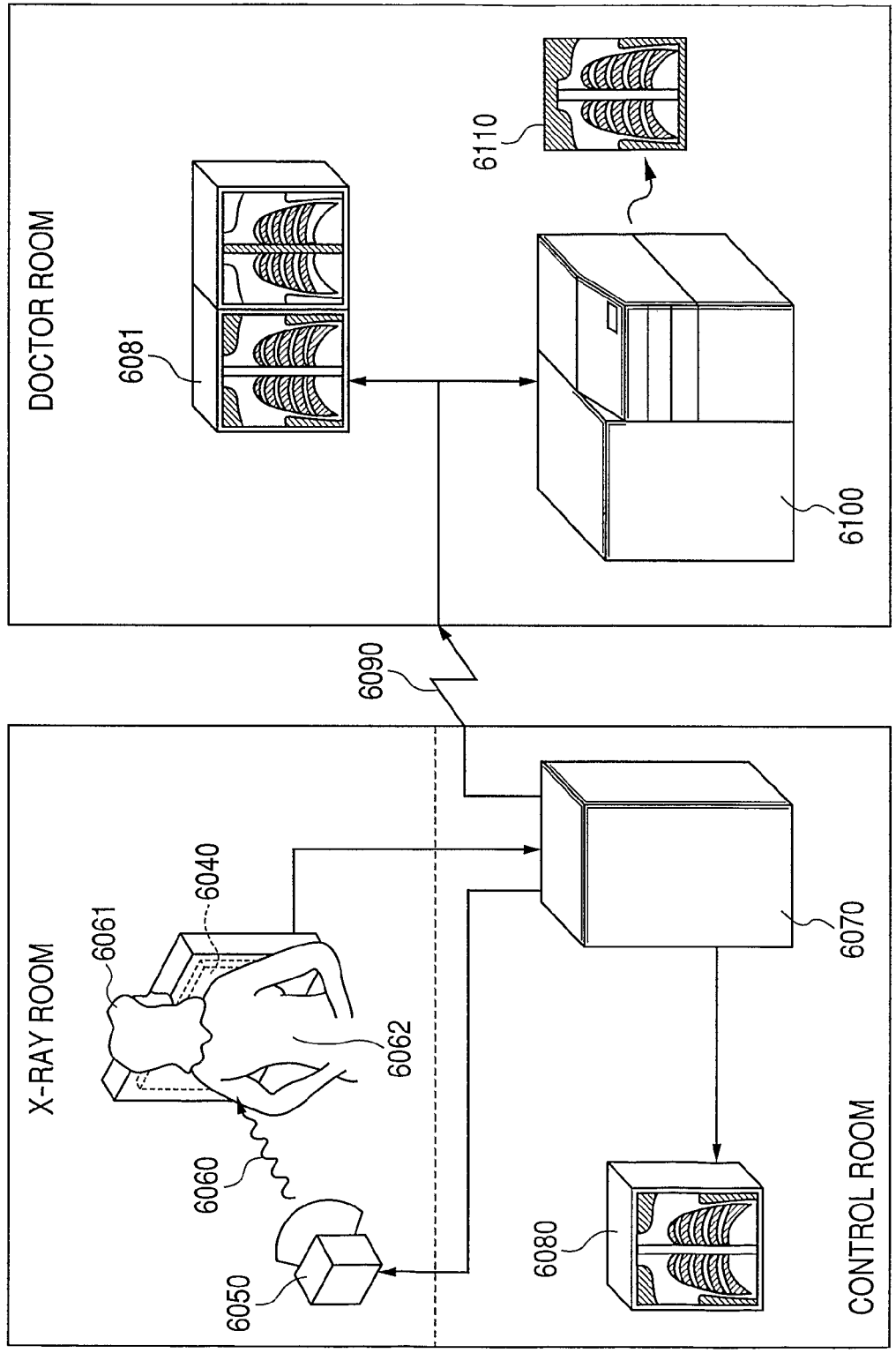
FIG. 9 is an explanatory diagram showing application of a radiation detecting apparatus to a radiation detecting system of the present invention.

FIG. 9 shows an application example of an X-ray diagnosis system which uses the FPD type radiation detecting apparatus of the present invention.

An X-ray 6060 emitted from an X-ray tube 6050 is transmitted through a breast 6062 of a patient or a person to be inspected 6061, and made to be incident on a radiation detecting apparatus 6040 having a scintillator (fluorescent material) mounted thereon. The incident X-ray contains information on the inside of a body of the patient 6061. The scintillator emits light corresponding to the entry of the X-ray, and the light is subjected to photoelectric conversion to obtain electric information. This information is converted into digital information, subjected to image processing by an image processor 6070 which becomes signal processing means, and can be observed by a display 6080 which becomes display means of a control room.

The image processor 6070 can transfer the electric signal output from the image sensor 6040 to a remote place via transmission processing means such as a telephone line 6090 to display the electric signal by display means (display) 6081 in a different place such as a doctor room. The electric signal output from the image sensor 6040 is saved in recording means such as an optical disk, and a doctor at the remote place can make diagnosis by using this recording means. The electric signal can also be recorded in a film 6110 by a film processor 6100 which becomes recording means.

As many apparently widely different embodiments of the present invention can be made without departing from the spirit and scope thereof, it is to be understood that the invention is not limited to the specific embodiments thereof except as defined in the claims.

The present invention is used for a photoelectric conversion apparatus, a radioactive ray detection substrate, and a radiation detecting apparatus which are used for a medical diagnosis apparatus, a non-destructive inspection apparatus, and the like.

This application claims priority from Japanese Patent Application Nos. 2005-201604 filed on Jul. 11, and 2006-181891 filed on Jun. 30, 2006, which are hereby incorporated by reference herein.

The invention claimed is:

1. A conversion apparatus, comprising:
an insulating substrate;
a pixel region including
  a switching element region in which a plurality of switching elements each including a first metal layer disposed over the insulating substrate, an insulating layer disposed over the metal layer, a first semiconductor layer, and a second metal layer are arranged in row and column directions,
  a conversion element region in which a plurality of conversion elements each including a lower electrode made of a third metal layer disposed over the switching element region, a second semiconductor layer disposed over the lower electrode, and an upper electrode made of a fourth metal layer disposed over the second semiconductor layer are arranged in row and column directions, and
  each pixels including the switching elements and the conversion elements;
a plurality of signal wirings including the second metal layer, signal wirings being connected to the plurality of switching elements of the column direction;
a plurality of bias wirings including the fourth metal layer, bias wirings being connected to the plurality of conversion elements;
an external signal wiring portion including the fourth metal layer outside the pixel region, the external signal wiring portion being connected to the signal wirings; and
an external bias wiring portion including the first metal layer outside the pixel region, the external bias wiring portion being connected to the plurality of bias wirings,
wherein the external signal wiring and the external bias wiring intersect each other.

2. A conversion apparatus according to claim 1, wherein the switching element includes a gate electrode including the first metal layer disposed over the insulating substrate, the insulating layer disposed over the gate electrode, the first semiconductor layer disposed over the insulating layer, and a source or drain electrode including the second metal layer disposed over the first semiconductor layer.

3. A conversion apparatus according to claim 1, wherein the bias wiring is connected to the plurality of conversion elements of the column direction, the external bias wiring portion is connected to the plurality of bias wirings arrayed in parallel in the row direction, and the external signal wiring portion and the external bias wiring portion intersect each other by sandwiching at least the insulating layer.

4. A conversion apparatus according to claim 3, further comprising an interlayer insulating layer arranged between the switching element region and the conversion element region,
wherein the external signal wiring portion and the external bias wiring portion further intersect each other by sandwiching the interlayer insulating layer.

5. A conversion apparatus according to claim 1, wherein the second metal layer and the third metal layer are including identical metal layers.

6. A conversion apparatus according to claim 1, further comprising a second external bias wiring portion including the fourth metal layer outside the pixel region and connected to the external bias wiring portion.

7. A conversion apparatus according to claim 1, further comprising a plurality of drive wirings including the first metal layer and connected to the plurality of switching elements of the row direction, and a external drive wiring portion including the fourth metal layer outside the pixel region and connected to the drive wirings.

8. A conversion apparatus according to claim 7, wherein:
the external drive wiring portion includes a first terminal;
the external signal wiring portion includes a second terminal;
the second external bias wiring portion includes a third terminal;
a drive circuit is connected to the first terminal to drive the switching element;
a signal processing circuit is connected to the second terminal to process an electric signal converted by the conversion element; and
a bias power source part is connected to the third terminal to apply a bias to the conversion element.

9. A conversion apparatus according to claim 1, wherein the conversion element is a photoelectric conversion element.

10. A conversion apparatus according to claim 9, wherein the photoelectric conversion element is a photoelectric conversion element further including a second insulating layer arranged between the lower electrode and the second semiconductor layer, and a second impurity semiconductor layer arranged between the second semiconductor layer and the upper electrode.

11. A conversion apparatus according to claim 9, wherein the photoelectric conversion element further includes a second impurity semiconductor layer arranged between the lower electrode and the second semiconductor layer, and a third impurity semiconductor layer arranged between the second semiconductor layer and the upper electrode.

12. A conversion apparatus according to claim 1, wherein the first semiconductor layer and the second semiconductor layer are made of amorphous silicon.

13. A radiation detecting apparatus, comprising:
the conversion apparatus according to claim 1;
a wavelength converter arranged on the conversion element layer, for converting an incident radioactive ray into light of a wavelength region, which is sensible by the visible light conversion element.

14. A radiation detecting system, comprising:
the radiation detecting apparatus according to claim 13;
signal processing means for processing a signal from the radiation detecting apparatus;
recording means for recording a signal from the signal processing means;
display means for displaying the signal from the signal processing means;
transmission processing means for transmitting the signal from the signal processing means; and
a radioactive ray source for generating radioactive rays.

15. A conversion apparatus comprising:
an insulating substrate;
a pixel region including a plurality of pixels in row and column directions, each pixel including
a switching element including a first metal layer disposed over the insulating substrate, an insulating layer disposed over the first metal layer, a first semiconductor layer, and a second metal layer, and
a conversion element including a lower electrode made of a third metal layer disposed over the switching element, a second semiconductor layer disposed over the lower electrode, and an upper electrode made of a fourth metal layer disposed over the second semiconductor layer;
signal wirings connected to the plurality of switching elements of the column direction; and
bias wirings connected to the plurality of conversion elements;
wherein at an intersection portion between the signal wiring and the bias wiring, the signal wiring is including the fourth metal layer, and the bias wiring is including the first metal layer.

* * * * *